United States Patent

Nakamura et al.

[15] 3,694,707

[45] Sept. 26, 1972

[54] SEMICONDUCTOR DEVICE

[72] Inventors: Masakatsu Nakamura; Toshio Yonezawa; Taketoshi Kato, all of Yokohama; Masaharu Watanabe, Kawasaki; Minoru Akatsuka, Yokohama, all of Japan

[73] Assignee: Tokyo Shibaura Electric Co. Ltd., Kawasaki-shi, Japan

[22] Filed: Sept. 29, 1970

[21] Appl. No.: 76,582

[30] Foreign Application Priority Data

March 27, 1970 Japan ......................45/25373
June 24, 1970 Japan ......................45/54335

[52] U.S. Cl....317/235 R, 317/235 AG, 317/235 AH
[51] Int. Cl...............................................H01l 7/00
[58] Field of Search......................................317/235

[56] References Cited

UNITED STATES PATENTS

| | | |
|---|---|---|
| 3,455,020 | 7/1969 | Dawson et al. ..............29/571 |
| 3,553,036 | 1/1971 | Werner et al.............148/187 |
| 3,485,684 | 12/1969 | Mann et al................148/147 |

*Primary Examiner*—John W. Huckert
*Assistant Examiner*—E. Wojciechowicz
*Attorney*—Flynn & Frishauf

[57] ABSTRACT

A semiconductor device comprising a semiconductor substrate having a pn-junction of which end is exposed at one main face of the substrate, and an insulating film covering the exposed end of the pn-junction, the protecting film including arsenic and phosphorus.

8 Claims, 7 Drawing Figures

SEMICONDUCTOR DEVICE

RELATED APPLICATION

This application is related to application Ser. No. 78,819, filed Oct. 7, 1970.

This invention relates to a semiconductor device having a protecting film covering an exposed end of a pn-junction.

In semiconductor devices such as diodes, transistors or integrated circuits, there is generally used an insulating film, for example, a silicon dioxide film, formed on the surface of a semiconductor substrate, especially at an exposed end of a pn-junction to prevent the device from contamination by moisture or harmful impurities so that the device is maintained in prescribed characteristics.

Such a silicon dioxide film may be formed on the substrate by heating the silicon substrate in an oxidization atmosphere to oxidize the surface thereof, or depositing silicon dioxide into the substrate by utilizing means of the reaction of $SiH_4 + O_2 \rightarrow SiO_2$. In both technics there is generated high compression stress, for example $3 \times 10^9$ dyne/cm$^2$ in the silicon dioxide film due to the great difference of the heat-expansion coefficients between the silicon dioxide film and substrate. Accordingly, where the silicon dioxide film of 5 microns thickness is formed on the silicon substrate a large number of cracks produce in the silicon dioxide film due to generating high stress therein, so that the film offers no protection. With the multi-lead semiconductor device such as an integrated circuit, this runs the risk of the short circuit among a plurality of leas-in wires. For this reason the silicon dioxide film can only be formed on the substrate without cracks with a thickness of about 3 microns max.

An object of the invention is to provide a semiconductor device having a no-crack insulating film covering the exposed end of a pn-junction formed in a semiconductor substrate, the film including therein arsenic and phosphorus, so that it may be formed in a sufficient thickness to protect the exposed end of the pn-junction frm contamination.

The present invention can be more fully understood from the following detailed description when taken in connection with reference to the accompanying drawings, in which.

Figure 1:
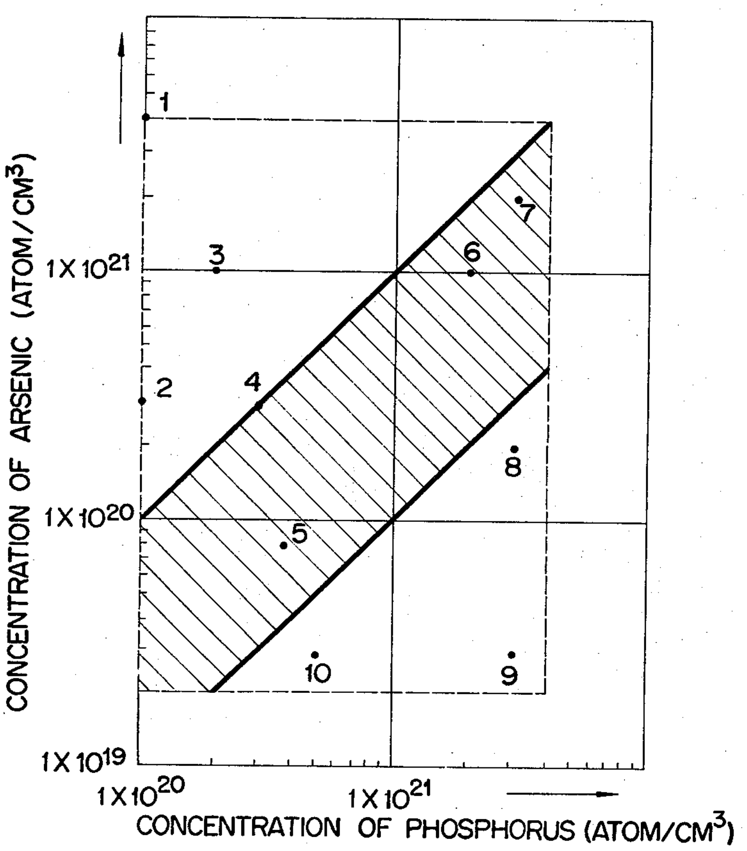
FIG. 1 is a graph showing the range of concentration of arsenic and phosphorus in which preferable results are obtained.

The inventors make clear the following matters by the various experiments.

Where a silicon dioxide film including arsenic and phosphorus is deposited on a silicon substrate, the heat-expansion coefficient of the film approaches to that of the substrate, so that no crack occurs in the film. The degree to which the heat-expansion coefficient of the film draws near that of substrate depends on the mixing ratio and the concentration of arsenic and phosphorus in the film. In FIG. 1 the region surrounded by dotted lines, particularly the shaded region, allows a silicon dioxide film to be formed in a predetermined thickness without causing harmful cracks. Namely, the former region realizes a film more than 20 microns thick presenting a stress of less than $3 \times 10^8$ dynes/cm$^2$, and the latter enables a film to be formed to a thickness of more than 50 microns with a stress of less than $1 \times 10^8$ dynes/cm$^2$. In detail, the former region is defined by arsenic having an impurity concentration of $2 \times 10^{19}$ to $4 \times 10^{21}$ atoms/cm$^3$ and phosphorus of $1 \times 10^{20}$ to $4 \times 10^{21}$ atoms/cm$^3$ and the latter region lies within the former as illustrated in FIG. 1 and in the latter the atomic concentrations of arsenic and phosphorus bear the ratio of 1 : 1 to 1 : 10.

The table 1 shows the relation between the concentration of phosphorus ($N^P$) and arsenic($N^{As}$), a stress generated in a silicon dioxide film and the maximum thickness of a film capable of being formed.

Table 1

| sample | $N^P$ (atom/cm$^3$) | $N^{As}$ (atom/cm$^3$) | stress (dyne/cm$^2$) | maximum thickness ($\mu$) |
|---|---|---|---|---|
| 1 | $1 \times 10^{20}$ | $4 \times 10^{21}$ | $2.8 \times 10^8$ | 20 |
| 2 | $1 \times 10^{20}$ | $3 \times 10^{21}$ | $3 \times 10^8$ | 30 |
| 3 | $2 \times 10^{20}$ | $2 \times 10^{20}$ | $3 \times 10^8$ | 20 |
| 4 | $3 \times 10^{20}$ | $3 \times 10^{20}$ | $0.8 \times 10^8$ | 50 |
| 5 | $4 \times 10^{20}$ | $8 \times 10^{19}$ | $0.8 \times 10^8$ | 50 |
| 6 | $2 \times 10^{21}$ | $1 \times 10^{21}$ | $0.7 \times 10^8$ | 60 |
| 7 | $3 \times 10^{21}$ | $2 \times 10^{21}$ | $0.7 \times 10^8$ | 55 |
| 8 | $3 \times 10^{21}$ | $2 \times 10^{20}$ | $2.8 \times 10^8$ | 35 |
| 9 | $3 \times 10^{21}$ | $3 \times 10^{19}$ | $3 \times 10^8$ | 20 |
| 10 | $5 \times 10^{20}$ | $3 \times 10^{19}$ | $3 \times 10^8$ | 25 |
| 11 | 0 | 0 | $2.39 \times 10^9$ | 3 |
| 12 | $1 \times 10^{21}$ | 0 | $9.27 \times 10^8$ | 10 |

In the above table the samples 1 to 10 respectively correspond to the dots in FIG. 1, the number of the dots according with the number of the sample, while the samples 11 and 12, relate to the prior art. The above tested silicon dioxide film doped with arsenic and phosphorus or the (P + As) doped oxide film was formed in such a manner that the silicon substrate was heated in the atmosphere of $SiH_4 + PH_3 + AsH_3 + O_2$ to deposit a silicon dioxide film there on and then heat-treated at a temperature of 1,000° C for 10 minutes to render the film dense.

As understood from the table 1, each sample allows a device to have a silicon dioxide film more than 20 microns thick without bringing in a stress of more than $3 \times 10^8$ dynes/cm$^2$, and particularly the samples 4 to 7 within the shaded area permit best results. For example, a first film which is directly attached to the substrate may be formed of silicon nitride and a second film being provided on the first film of (P + As) doped oxide, or the first film may be formed of pure silicon dioxide, second film of (P + As) doped oxide and finally an additional third film being mounted on the second film of silicon nitride.

The effects described above may be also obtained from the utilization of other suitable semiconductor substrates made of such as germanium or gallium arsenide and other protecting films such as silicon nitride.

Figure 2:
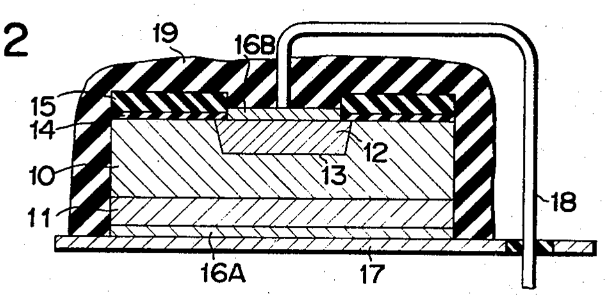
FIG. 2 is a cross sectional view of a planar diode according to one embodiment of the invention.

There will now be described a semiconductor device according to one embodiment of the invention with reference to FIG. 2.

The $n^+np^+$-type planar diode includes an n-type silicon substrate 10 on one main side of which is provided an $n^+$-type region 11 by diffusing n-type impurities such as phosphorus. A $p^+$-type island region 12 is formed in the other main side of the substrate by means of selective diffusion so that a pn-junction 13 is defined therebetween with its end exposed on the face of the substrate. As the latter main side, (111) face may be utilized. A thin silicon dioxide film 14 is deposited on the latter main side of the substrate and on the exposed end of the pn-junction. The silicon dioxide film 14 is covered with another silicon dioxide film 15 containing arsenic of $1 \times 10^{21}$ atoms/$cm^3$ and phosphorus of $2 \times 10^{21}$ atoms/$cm^3$. The second insulating protecting film 15 may be so formed as to have a thickness of 3 to 15 microns. The resultant assembly may be heated at a temperature of 1,000° C for about 10 minutes for permitting densification of the insulating films. On the n-type and p-type regions 11 and 12 are respectively mounted anode and cathode electrodes 16A and 16B. On the anode electrode 16A there is attached a tungsten plate 17, for example of an envelope (not shown), while to the cathode electrode 16B a lead-in wire 18 is connected. The substrate and protecting films are finally covered with an epoxy resin 19 at least except for the lead-in wire.

Figure 3:
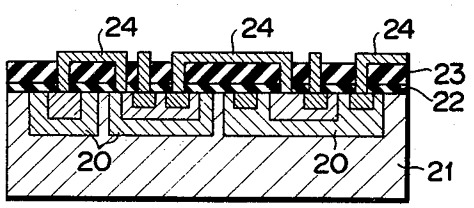
FIG. 3 is a cross sectional view of an integrated circuit according to another embodiment of the invention.

FIG. 3 shows an integrated circuit as another embodiment. The circuit includes in a silicon substrate 21 three semiconductor active elements 20 each having at least one pn-junction. The end of the pn-junction is exposed on the main side of the substrate 21. On the main side there is formed a pure silicon dioxide film 22 of 2 microns in thickness except on a part of the element where an electrode is to be attached. Another silicon dioxide film 23 is deposited on the insulating film 22, which includes arsenic and phosphorus each having an impurity concentration of $3 \times 10^{20}$ atoms/$cm^3$. Metal electrodes 24 are respectively connected to the active elements 20 at suitable positions.

Figure 4A:
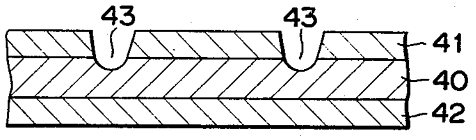
FIGS. 4A to 4D are cross sections illustrating a mesa diode at a different stage of manufacture.
Figure 4B:
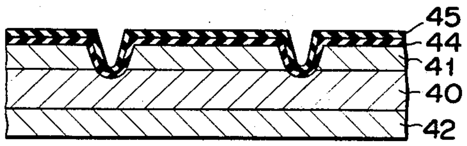
Figure 4C:
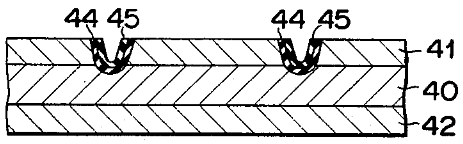
Figure 4D:
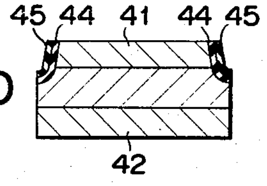

Referring to FIGS. 4A to 4D, there will now be described a method of manufacturing a masa diode. From opposite sides of a p-type silicon wafer 40 of 300 microns thickness, phosphorus and boron are diffused so that an $n^+$-type region 41 of 30 microns depth and a $p^+$-type region 42 of 50 microns depth are formed in the both faces, respectively. Grooves 43 are formed in one main face of the wafer by selectively etching in such a manner that its depth is deeper than that of said $n^+$-type region 41 (FIG. 4A). On that face of the wafer and the walls of the grooves is deposited a first insulating film 44 of silicon dioxide and then on the entire face of the first film is formed a second insulating film 45 of (P + As) doped oxide including phosphorus of $2 \times 10^{21}$ atoms/$cm^3$ and arsenic of $5 \times 10^{20}$ atoms/$cm^3$ (FIG. 4B). The second protecting film 45 may be formed in such a manner that the wafer is heated at a temperature of 500° C in the atmosphere of 12/hr $SiH_4$, 190/hr $PH_3$, 47/hr$AsH_3$100/hr $O_2$. The substrate 40 attached to insulating films is then heated at a temperature of 1,000° C for 10 minutes in a nitrogen atmosphere to sufficiently dense the films. The double silicon dioxide film is removed from the surface of the wafer except on the inner wall of the grooves 43 (FIG. 4C). The face of the wafer is scribed along the central line of the grooves thereof and thereby the wafer is divided into mesa diode elements (FIG. 4D).

Table 2 shows the results of life time tests on the above-mentioned diodes with various thicknesses of (P + As) doped oxide films compared with those on the prior art diodes.

Table 2

| Sample | Thickness of a Film I | II | Initial yield(%) | Yield after 1st test | Yield after 2nd test judgement |
|---|---|---|---|---|---|
| 1 | — | — | 87 | 86 | 83 |
| 2 | 2 | — | 89 | 26 | 0 |
| 3 | 0.2 | 2 | 91 | 37 | 12 |
| 4 | 0.2 | 3 | 88 | 86 | 81 |
| 5 | 0.2 | 5 | 93 | 93 | 92 |
| 6 | 0.2 | 10 | 91 | 91 | 91 |
| 7 | 0.2 | 15 | 89 | 89 | 89 |
| 8 | 0.2 | 20 | 95 | 94 | 93 |
| 9 | 0.2 | 50 | 98 | 98 | 98 |
| 10 | 0.2 | 2 | 99 | 99 | 99 |

In the table 2, the thickness of the film denotes the thickness of the silicon dioxide film in which I is a pure silicon dioxide film and II is a (P + As) doped silicon dioxide film, "initial yield" denotes a yield before the life time test; and "1st test" and "2nd test" respectively represent a life time test for 100 hr and 1,000 hr, the life time test is made by applying D.C. 300 V to the diode and measuring the reverse current through it, and the yield is determined on the level of 1 mA.

The samples 1 to 3 accord to the prior art devices wherein only the sample 1 is a mesa type diode provided with a metal envelope and in the film shown by II of the sample 3 is only doped phosphorus. The sample 10 is the case of using a metal envelope.

As clearly seen from the table 2, the diodes of the present invention (Samples 4 to 10) are manufactured in a high initial yield and also after the first and second life time tests, with very slightly reduced characteristics.

What we claim is:

1. A semiconductor device having a strain-compensated passivating film comprising:
   a. a silicon semiconductor substrate; and
   b. a silicon dioxide film covering at least a part of the surface of said substrate, said film containing arsenic and phosphorus to compensate for a strain between said substrate and said film, the impurity concentrations of said arsenic and phosphorus from being $2\times10^{19}$ to $4\times10^{21}$ atoms/$cm^3$ and from $1\times10^{20}$ to $4\times10^{21}$ atoms/$cm^3$, respectively, and said arsenic and phosphorus being mixed in a ratio of atomic concentrations of from 1 : 1 to 1 : 10.

2. A semiconductor device of claim 1, wherein said part of the surface of said substrate is a main surface at which a pn-junction formed in said substrate is exposed.

3. A semiconductor device of claim 1, wherein said part of the surface of said substrate is a side surface etched selectively at which a pn-junction formed in said substrate.

4. A semiconductor device having a strain-compensated passivating film comprising:
   a. a silicon semiconductor substrate;
   b. a first insulating film directly covering at least a part of the surface of said substrate; and
   c. a second silicon dioxide film deposited on said first film, and containing arsenic and phosphorus to compensate for a strain between said substrate and film, the impurity concentrations of said arsenic and phosphorus being from $2\times10^{19}$ to $4\times10^{21}$ atoms/cm$^3$ and from $1\times10^{20}$ to $4\times10^{21}$ atoms/cm$^3$, respectively, and said arsenic and phosphorus being mixed in a ratio of atomic concentrations of from 1 : 1 to 1 : 10.

5. A semiconductor device of claim 4, wherein said part of the surface of said substrate is a main surface at which a pn-junction formed in said substrate is exposed.

6. A semiconductor device of claim 4, wherein said part of the surface of said substrate is a side surface etched selectively at which a pn-junction formed in said substrate is exposed.

7. A semiconductor device of claim 1, wherein said arsenic and said phosphorus are included in said silicon dioxide film simultaneously.

8. A semiconductor device of claim 4, wherein said arsenic and said phosphorus are included in said second silicon dioxide film simultaneously.

* * * * *